United States Patent
Houston et al.

(10) Patent No.: US 9,858,986 B2
(45) Date of Patent: Jan. 2, 2018

(54) INTEGRATED CIRCUIT WITH LOW POWER SRAM

(75) Inventors: Theodore W. Houston, Richardson, TX (US); Srinivasa Raghavan Sridhara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 12/848,294

(22) Filed: Aug. 2, 2010

(65) Prior Publication Data

US 2012/0026808 A1 Feb. 2, 2012

(51) Int. Cl.
*G11C 11/413* (2006.01)

(52) U.S. Cl.
CPC .................... *G11C 11/413* (2013.01)

(58) Field of Classification Search
CPC ................................................ G11C 11/413
USPC ................. 365/154, 156, 226–229; 326/103; 327/379
See application file for complete search history.

(56) References Cited

U.S. PATENT DOCUMENTS

| | | | | |
|---|---|---|---|---|
| 5,297,097 A * | 3/1994 | Etoh | ....................... | G11C 5/147 327/530 |
| 5,666,082 A * | 9/1997 | Wilenken | ........... | H03K 17/0822 327/379 |
| 6,181,608 B1 * | 1/2001 | Keshavarzi | ........... | G11C 11/412 365/154 |
| 6,724,648 B2 * | 4/2004 | Khellah | ................ | G11C 11/417 365/154 |
| 6,891,745 B2 * | 5/2005 | Liaw | .............................. | 365/154 |
| 7,079,426 B2 * | 7/2006 | Zhang | ................... | G11C 11/413 365/226 |
| 7,092,280 B2 * | 8/2006 | Joshi | ............................. | 365/154 |
| 7,106,620 B2 * | 9/2006 | Chang | ................... | G11C 11/413 365/154 |
| 7,164,596 B1 * | 1/2007 | Deng | .................... | G11C 11/419 365/154 |
| 7,404,154 B1 * | 7/2008 | Venkatraman | ...... | H01L 27/0207 326/103 |
| 7,414,877 B2 * | 8/2008 | Burnett et al. | ................ | 365/154 |
| 7,447,059 B2 * | 11/2008 | Uematsu | ........................ | 365/154 |
| 7,511,989 B2 * | 3/2009 | Thomas et al. | ............... | 365/154 |
| 7,529,117 B2 * | 5/2009 | Liaw | .............................. | 365/154 |
| 7,577,014 B2 * | 8/2009 | Yamagami | ............ | G11C 11/413 365/154 |
| 7,623,405 B2 * | 11/2009 | Lysinger | ................ | G11C 5/143 365/154 |
| 7,764,535 B2 * | 7/2010 | Nguyen | ................... | G11C 7/12 365/154 |
| 7,768,820 B2 * | 8/2010 | Houston et al. | ............... | 365/154 |
| 7,778,075 B2 * | 8/2010 | Ishikura et al. | ............... | 365/154 |

(Continued)

OTHER PUBLICATIONS

Sridhara, Srinivasa Raghavan, U.S. Appl. No. 12/423,378 "Low-Power Operation of Static Memory in a Read-Only Mode," filed Apr. 14, 2009.

*Primary Examiner* — Vu Le
*Assistant Examiner* — Sung Cho
(74) *Attorney, Agent, or Firm* — Rose Alyssa Keagy; Charles A. Brill; Frank D. Cimino

(57) ABSTRACT

An integrated circuit containing a SRAM memory with SRAM bits optimized to have a lower minimum read voltage than the minimum write voltage. A method for reading a SRAM memory bit using a read voltage that is lower than the write voltage.

24 Claims, 3 Drawing Sheets

(56) References Cited

U.S. PATENT DOCUMENTS

| | | | | |
|---|---|---|---|---|
| 7,817,490 B1* | 10/2010 | Sridhara | ............... | G11C 11/417 |
| | | | | 365/154 |
| 7,852,692 B2* | 12/2010 | Zhang et al. | ................. | 365/226 |
| 7,924,640 B2* | 4/2011 | Deng et al. | .................... | 365/154 |
| 7,936,623 B2* | 5/2011 | Deng et al. | .................... | 365/154 |
| 8,064,279 B2* | 11/2011 | Houston et al. | .............. | 365/154 |
| 8,072,797 B2* | 12/2011 | Sachdev et al. | ............. | 365/154 |
| 8,634,263 B2* | 1/2014 | Kenkare et al. | ............. | 365/226 |
| 2008/0071511 A1* | 3/2008 | Lin | ..................... | G06F 17/5036 |
| | | | | 703/14 |
| 2009/0207675 A1* | 8/2009 | Kengeri | ................. | G11C 5/147 |
| | | | | 365/189.14 |
| 2011/0068400 A1* | 3/2011 | Wang | ................... | G11C 11/412 |
| | | | | 257/347 |

* cited by examiner

INTEGRATED CIRCUIT WITH LOW POWER SRAM

CROSS-REFERENCE TO RELATED APPLICATIONS

The following co-pending patent application is related and hereby incorporated by reference: U.S. patent application Ser. No. 12/423,378. With its mention in this section, this patent application is not admitted to be prior art with respect to the present invention.

FIELD OF THE INVENTION

This invention relates to the field of integrated circuits. More particularly, this invention relates to the design of SRAMs for low power operation.

DETAILED DESCRIPTION

Figure 1A:
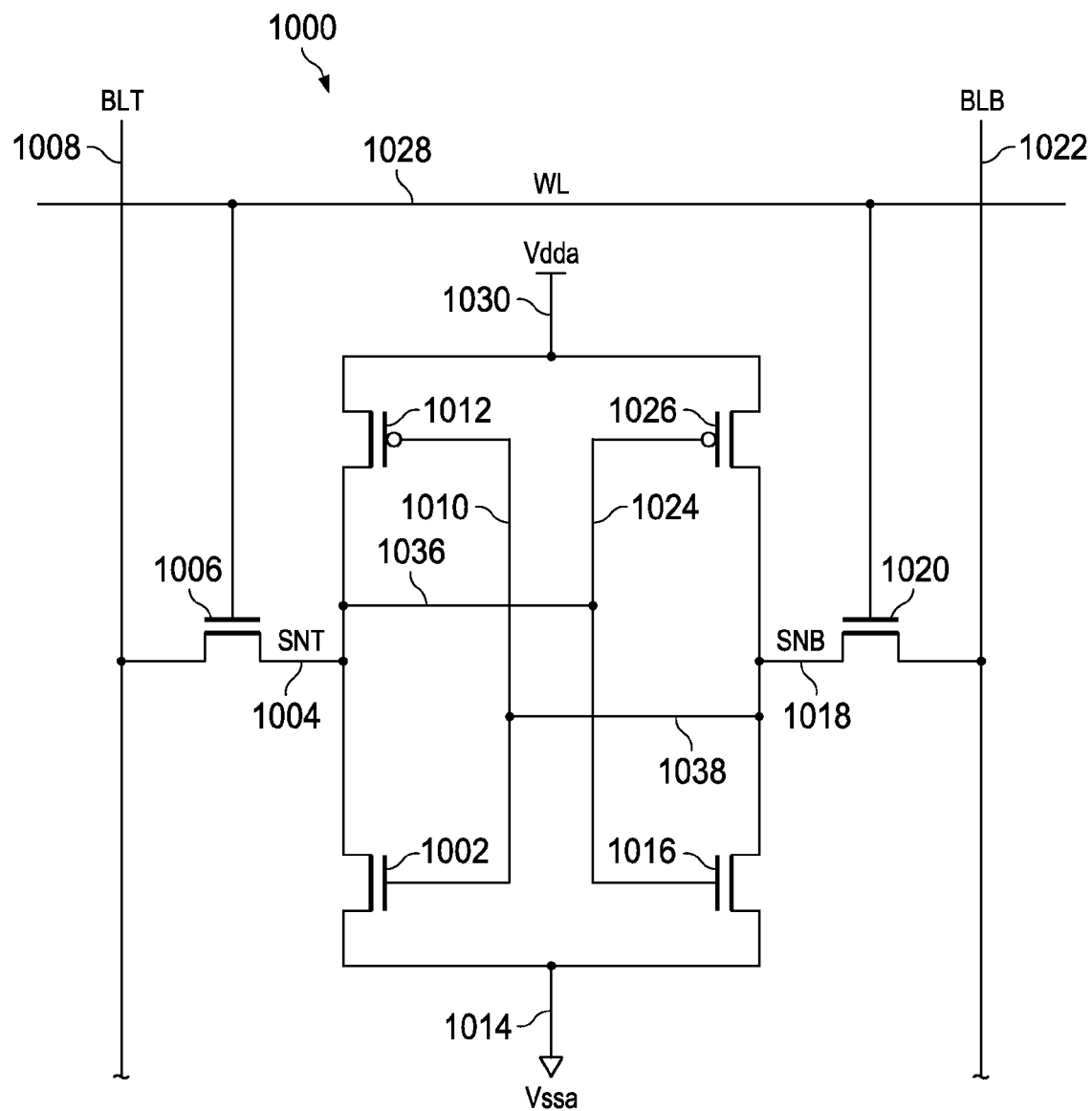
FIG. 1A a circuit diagram of a 6T SRAM bit.

Example embodiments described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide an understanding of the example embodiments. One skilled in the relevant art, however, will readily recognize that embodiments can be practiced without one or more of the specific details or with other methods. In other instances, well-known structures or operations are not shown in detail to avoid obscuring an embodiment. The example embodiments are not limited by the illustrated ordering of acts or events, as some acts may occur in different orders and/or concurrently with other acts or events. Furthermore, not all illustrated acts or events are required to implement a methodology in accordance with an embodiment.

The term "balanced SRAM array" refers to an SRAM array that contains balanced SRAM bits which have been optimized so that the minimum voltage for read and the minimum voltage for write are approximately the same.

The term "unbalanced SRAM array" refers to an SRAM array that contains unbalanced SRAM bits that have been optimized so that the minimum voltage for read is lower than the minimum voltage for write.

The term "logic voltage" refers to the operating voltage of the transistors in the logic circuits outside the SRAM array. The logic voltage is usually the power supply voltage, Vdd.

The term "balanced write Vdda" refers to the SRAM array voltage during a write operation of a balanced SRAM bit and the term "unbalanced write Vdda" refers the SRAM array voltage during a write operation of an unbalanced SRAM bit.

Figure 1B:
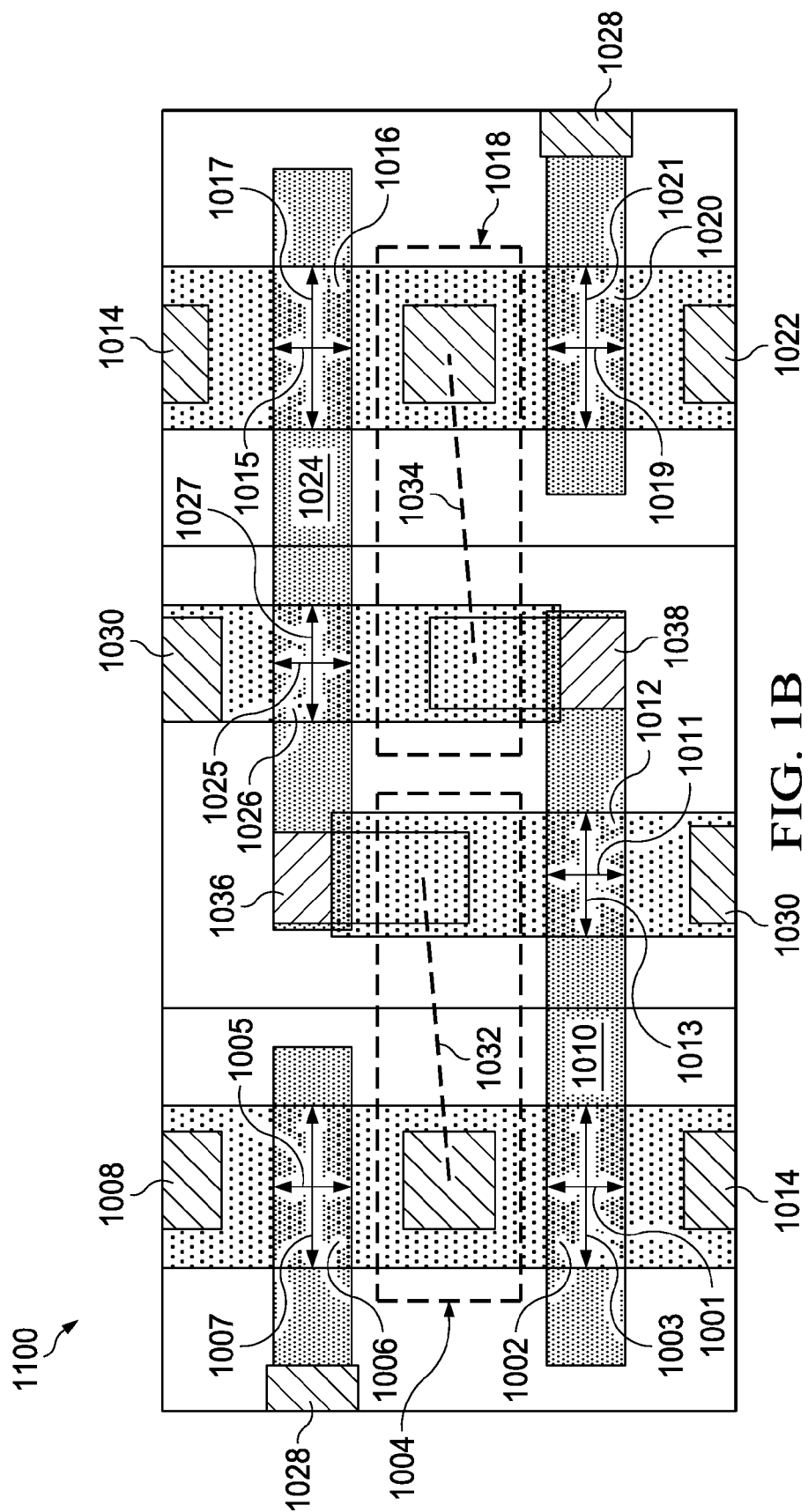
FIG. 1B a layout of a 6T SRAM bit.

The term "balanced read Vdda" refers to the SRAM array voltage during a read operation of a balanced SRAM bit and the term "unbalanced read Vdda" refers the SRAM array voltage during a read operation of an unbalanced SRAM bit FIG. 1A is a circuit diagram 1000 and FIG. 1B is a layout 1100 of an example 6T SRAM bit. (Note that the geometries on SRAM bits in actual layouts incorporating this embodiment may differ significantly from those shown in FIG. 1B.) Equivalent elements are referenced by the same number in both FIGS. 1A and 1B for clarity. The 6T SRAM bit contains 6 transistors: two NMOS passgate transistors, 1006 and 1020, two NMOS pulldown (driver) transistors, 1002 and 1016, and two PMOS pullup (load) transistors, 1012 and 1026. NMOS pulldown transistor 1002 plus PMOS pullup transistor 1012 form a first inverter and NMOS pulldown transistor 1016 plus PMOS pullup transistor 1026 for a second inverter. Storage node true (SNT) 1004 (which is indicated by the dotted line box in FIG. 1B) is formed by the source/drain of NMOS pulldown transistor 1002 and PMOS pullup transistor 1012 of the first inverter (they are connected together by a metal-1 strap that is indicated by dashed line 1032 in FIG. 1B). The stretched contact 1036 shorts the storage node (SNT) to the gate 1024 of the second inverter. Therefore, the voltage on SNT 1004 controls the voltage on the gate 1024 of the second inverter.

Likewise, storage node bar (SNB) (which is indicated by the dotted line box in FIG. 1B) 1018 is formed by the source/drain of NMOS pulldown transistor 1016 and PMOS pullup transistor 1026 (they are connected together by a metal-1 strap indicated by dashed line 1034 in FIG. 1B). The stretched contact 1038 shorts SNB 1018 to the gate 1010 of the first inverter. Therefore, the voltage on SNB 1018 controls the gate 1010 voltage of the first inverter.

The sources of the PMOS pullup (load) transistors 1012 and 1026 are connected to the array voltage, Vdda 1030 (which is usually the power supply voltage). The sources of NMOS pulldown (driver) transistors 1002 and 1016 are connected to Vssa 1014 (which typically is ground). One side of NMOS passgate transistor 1006 is connected to SNT 1004, and the other side is connected to bit line (BL) 1008. One side of NMOS passgate transistor 1020 is connected to SNB 1018 and the other side is connected to bit line bar (BLB) 1022. The gates of both passgate transistors, 1006 and 1020, are connected to wordline (WL) 1028.

To illustrate a write operation of SRAM bit 1000 in FIG. 1 a logic state defined as a "0" state with SNT 1004 at a low voltage and SNB 1018 at a high voltage is selected as the initial condition. Since the low voltage on SNT 1004 controls the gate 1024 voltage on the second inverter, PMOS pullup transistor 1026 is on, thereby connecting SNB 1018 to Vdda 1030. Furthermore, NMOS pulldown transistor 1016 is off, thereby preventing SNB 1018 from discharging to Vssa 1014. Likewise since the high voltage on SNB 1018 controls the gate 1010 voltage of the first inverter, the PMOS pullup transistor 1012 is off, thereby preventing SNT 1004 from charging to Vdda 1020. Furthermore, NMOS pulldown transistor 1002 is on, thereby keeping SNT 1004 discharged to Vssa 1014.

During the operation to write a "1" into SRAM bit 1000, BLT 1008 is precharged to a voltage near Vdda 1030 and BLB 1022 is precharged to a voltage near Vssa 1014. A voltage pulse is then applied to wordline 1028 to turn the passgate transistors 1006 and 1020 on. Initially since SNT 1004 is low, pulldown transistor 1016 is off and pullup transistor 1026 is on. The low voltage on BLB 1022 is able to discharge the voltage on SNB 1018 (from high to low) because the passgate transistor 1020 is designed to be stronger than pullup transistor 1026. As the voltage on SNB 1018 is pulled low it pulls the gate voltage on the first inverter below the trip point; thereby turning pulldown transistor 1002 off and turning pullup transistor 1012 on. SNT 1004 is then pulled high both by the pullup transistor 1012 and by BLT 1008 through passgate transistor 1006. Thus, a write is successfully accomplished with low voltage now on SNB 1018 and high voltage now on SNT 1004. It is to be noted that to avoid write errors, the passgate transistor 1020 must be stronger than pullup transistor 1026 so that SNB 1018 may be discharged below the trip voltage.

Another way to increase the write margin is to increase Vdda. With increased Vdda 1030, the transition voltage of the inverters is raised so that the storage node 1018 does not have to be pulled as low to reach the trip voltage for a successful write.

To illustrate a read operation, an SRAM bit 1000 having a logic state "0" is again used as the starting condition (i.e. SNT 1004 at a low voltage and SNB 1018 at a high voltage). Since the low voltage on SNT 1004 controls the gate 1024 voltage on the second inverter, PMOS pullup transistor 1026 is on and NMOS pulldown transistor 1016 is off. Likewise since the high voltage on SNB 1018 controls the gate 1010 voltage of the first inverter, PMOS pullup transistor 1012 is off and NMOS pulldown transistor 1002 is on.

During a read operation, BLT 1008 and BLB 1022 are initially precharged to a voltage near Vdda 1030 and then disconnected from the power supply. A voltage pulse is then applied to the wordline 1028 to turn on the passgate transistors 1006 and 1020. The high voltage on BLB 1022 keeps the voltage high on SNB 1018. Since the voltage on SNB 1018 is kept high, the PMOS pullup transistor 1012 in the first inverter remains turned off and NMOS pulldown transistor 1002 remains turned on. When passgate transistor 1006 is turned on, the high precharge voltage on BLT 1008 tries to pull the voltage on SNT 1004 up, whereas pulldown transistor 1002 (which is also turned on) tries to discharge SNT 1004 to Vssa. The stronger the passgate transistor 1006 is relative to the pulldown transistor 1002, the higher the SNT 1004 voltage is raised. If the voltage on SNT rises above the trip voltage, the bit is subject to upset and a read error may occur. It is to be noted that for read stability, the passgate 1006 needs to be weak so pulldown transistor 1002 is able to keep SNT 1004 below the trip point.

The write margin is improved when the passgate transistors 1020 and 1006 are stronger than their respective pullup transistors 1026 and 1012. The read margin is improved when the passgate transistors 1006 and 1020 are weaker than their respective pulldown transistors 1002 and 1016. As a result, improving the write margin degrades the read margin and visa versa. Therefore, the strength of passgate transistors 1020 and 1006 is a balance between read and write stability.

In conventional SRAM arrays the SRAM bits are balanced so that the minimum write voltage and the minimum read voltage are approximately the same. Typically the array voltage (Vdda) in conventional SRAM arrays is the same during read and write operations. In addition, the array voltage (Vdda) in conventional SRAM arrays is the same as the core logic power supply voltage.

For integrated circuits containing embedded SRAM arrays, SRAM data is often read from an SRAM bit many more times than it is written into an SRAM bit. Therefore, a reduction in the consumption of operating power may be realized by just reading data at a reduced voltage. This may be accomplished in an example embodiment by raising the minimum operating voltage for write to allow the minimum operating voltage for read to be reduced; thereby producing an unbalanced SRAM bit which may be operated with lower power.

An example unbalanced SRAM embodiment is illustrated in Table 1, infra. The pullup transistor in the example unbalanced bit is made stronger (e.g. have a higher drive current) by increasing the gate width 1013 of the pullup transistor 1012 from 0.15 um in the balanced bit to 0.20 um in the unbalanced bit (possibly providing at least a 10% increase in the drive current of the pullup transistor in an unbalanced SRAM bit over the drive current of the pullup transistor in a balanced SRAM bit). In addition the passgate transistor 1006 is made weaker (e.g. have a lower drive current) by increasing the gate length 1005 of the passgate transistor from 0.15 um the balanced bit to 0.19 in the unbalanced bit (possibly providing at least a 10% decrease in the drive current of the passgate transistor in an unbalanced SRAM bit over the drive current of the passgate transistor in a balanced SRAM bit). As shown in the table, the result of these changes may be to decrease the minimum array voltage at which the SRAM bit may be read and to increase the minimum array voltage at which the SRAM bit may be written. The minimum read voltage in the example embodiment has been reduced from 0.85 volts in the balanced bit to 0.71 volts in the unbalanced bit. Furthermore, the minimum write voltage has been increased from 0.85 volts in the balanced bit to 0.95 volts in the unbalanced bit. An integrated circuit that utilizes the unbalanced bit according to the example embodiment may write to the SRAM with a minimum voltage of 0.95 volts and may read from the SRAM with a minimum voltage of 0.71 volts.

TABLE 1

| CELL ATTRIBUTE | UNBALANCED SRAM CELL | BALANCED SRAM CELL |
|---|---|---|
| Minimum read voltage | 0.71 | 0.85 |
| Minimum write voltage | 0.95 | 0.85 |
| Pullup Transistor width | 0.2 | 0.15 |
| Passgate Transistor length | 0.19 | 0.15 |

Since power is proportional to the square of the voltage, $P=V^2/R$ (where P=power, V=voltage, and R=resistance), a power savings on the order of 30% may be realized during the read operation. [P1/P2=(0.71)(0.71)/(0.85)(0.85)=0.697]

The example embodiment supra, the unbalanced SRAM for reduced power during read was achieved by increasing the transistor width 1013 and 1027 of the pullup transistors, 1012 and 1026, to make them stronger, and/or increasing the gate length 1005 and 1019 of the passgate transistors, 1006 and 1020 to make them weaker. There are a number of other methods that may be used to achieve an unbalanced SRAM bit. For example, the threshold voltage (Vt) of the pullup transistors, 1012 and 1026, (i.e. the turn on voltage of the pullup transistors) may be reduced by approximately 10% or more to make them stronger and the threshold voltage of the passgate transistors, 1006 and 1020, (i.e. the turn on voltage of the passgate transistors) may be increased by approximately 10% or more to make them weaker. The gate length, 1001 and 1015, of the pulldown transistors, 1002 and 1016 may be reduced by approximately 10% or more to make them stronger and/or the transistor width, 1007 and 1021, of the passgate transistors, 1006 and 1020, may be reduced by approximately 10% or more to make them weaker. Alternatively, the gate length, 1011 and 1025, of the pullup transistors, 1012 and 1026 may be reduced by approximately 10% or more to make them stronger and/or the transistor width, 1007 and 1021, of the passgate transistors, 1006 and 1020, may be reduced by approximately 10% or more to make them weaker. Moreover, the transistor width, 1003 and 1017, of pulldown transistors, 1002 and 1016, may be increased by approximately 10% or more to make them stronger and/or the gate length, 1005 and 1019, of the passgate transistors, 1006 and 1020, may be increased by approximately 10% or more to make them weaker. The Vt, transistor width, and gate length adjustments may be used individually or may be used together in various combinations to achieve the desired result of optimizing an unbalanced SRAM bit.

The 6T SRAM bit is used herein for purposes of illustration, but it is understood that the example embodiment applies equally well to other SRAM bit designs. For example, the example embodiment may be implemented in 8T or 10T SRAM bit designs The example embodiment integrated circuit 2000, shown in FIG. 2, contains a balanced SRAM memory array 2002 with balanced SRAM bits 1000 where data is written into and read from the balanced SRAM bits 1000 at the same voltage. That voltage may be a balanced read Vdda and a balanced write Vdda provided by the voltage generator 2010 (as indicated by solid line 2018) or by the power supply 2012 (as indicated by dashed line 2024). The integrated circuit 2000 also contains an unbalanced SRAM memory array 2006 with unbalanced SRAM bits 2008 where data is written into the unbalanced SRAM memory bits using an unbalanced read Vdda that may be 50 mV or more lower than the unbalanced write Vdda. Both the unbalanced read Vdda and the unbalanced write Vdda may also be provided by voltage generator circuit 2010 (as indicated by solid line 2016) or may be derived from the power supply 2012 (as indicated by dashed line 2022). In addition, the integrated circuit 2000 contains an SRAM memory array 2004 with both balanced SRAM bits 1000 and unbalanced SRAM bits 2008. The balanced read Vdda, the balanced write Vdda, and the unbalanced write Vdda may be supplied by voltage generator 2010 (as indicated by solid line 2014) or by the power supply 2012 (as indicated by dashed line 2020). The unbalanced read Vdda may be 50 mV or more lower than the unbalanced write Vdda and it may be a voltage that is supplied by the voltage generator 2010 or it may be a step down voltage from the power supply 2012. There is extra benefit (in terms of reduced circuit area) if the SRAM Vdda may be derived from the same power supply 2012 (i.e. Vdd) that is used by the logic transistors of the integrated circuit 2000 (using simple circuitry to step down the Vdd voltage to a Vdda voltage, for example). Even more benefit is realized (in terms of reduced circuit area) if the SRAM Vdda is equal to the Vdd of the integrated circuit 2000 (so no additional circuitry is required). The balanced read Vdda, the balanced write Vdda, and the unbalanced write Vdda may be the same as the logic transistor Vdd 2012. In an alternative embodiment, the unbalanced write Vdda may be higher than the logic transistor Vdd 2012; allowing the unbalanced read Vdda to be lowered further (possibly saving additional operating power).

The balanced SRAM memory array 2002 and the balanced/unbalanced SRAM memory array 2004 contain balanced SRAM bits 1000 that are optimized to have approximately equal minimum read and minimum write Vddas. The unbalanced SRAM array 2006 and the balanced/unbalanced SRAM array 2004 contain unbalanced SRAM bits 2008 that are optimized to have a minimum unbalanced read Vdda that is 50 mV or more lower than the minimum unbalanced write Vdda (or possibly 240 mV lower). Since the unbalanced read Vdda in both the unbalanced SRAM array 2006 and the balanced/unbalanced SRAM array 2004 is lower than the balanced read voltage for both the balanced SRAM array 2004 and the balanced/unbalanced SRAM array 2004; the operating power that is consumed when reading unbalanced SRAM bits 2008 may be substantially lower than the operating power that is required when reading the balanced SRAM bits 1000.

Figure 2:
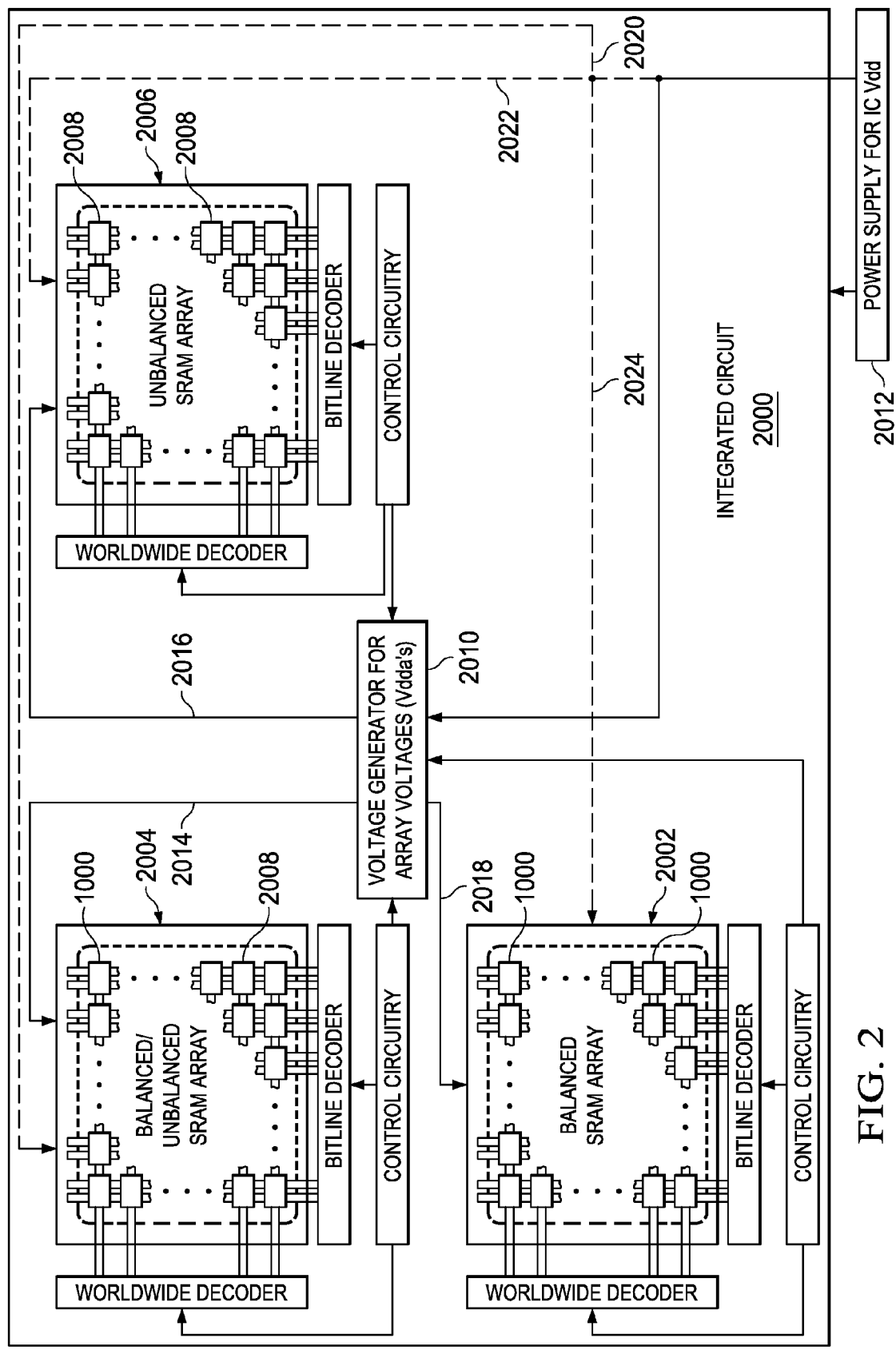
FIG. 2 illustrates an integrated circuit containing a balanced SRAM memory array in which data is read and written at the same voltage plus an unbalanced SRAM memory array in which data is read and written at different voltages.

One voltage generator 2010 is shown in FIG. 2 to supply the array voltages to the balanced 2002, the balanced/unbalanced 2004, and the unbalanced 2006 SRAM arrays. However, a separate voltage generator for each SRAM array may also be used. In addition, the power supply voltage 2012 may supply the balanced read Vdda, the balanced write Vdda, and it may also supply the unbalanced write Vdda. The lower voltage unbalanced read Vdda may also be derived from the power supply 2012 (possibly saving circuit area and cost).

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit, comprising:
an SRAM array;
an unbalanced SRAM bit in said SRAM array, said unbalanced SRAM bit including a pullup transistor; and
a voltage generator coupled to said SRAM array that provides a minimum unbalanced read array voltage to said pullup transistor during a read operation of said unbalanced SRAM bit and provides a minimum unbalanced write array voltage to said pullup transistor during a write operation of said unbalanced SRAM bit, said minimum unbalanced read array voltage being lower than said minimum unbalanced write array voltage when said SRAM array is operating in read/write mode.

2. The integrated circuit of claim 1, wherein said minimum unbalanced write array voltage is equal to a logic transistor Vdd.

3. The integrated circuit of claim 1, wherein said minimum unbalanced read array voltage is at least 50 mV lower than said minimum unbalanced write array voltage.

4. The integrated circuit of claim 1, wherein said minimum unbalanced read array voltage is up to 240 mV lower than said minimum unbalanced write array voltage.

5. The integrated circuit of claim 1, further comprising a balanced SRAM bit in said SRAM array coupled to said voltage generator, wherein said voltage generator additionally provides a balanced write array voltage to said SRAM array during a write operation of said balanced SRAM bit and provides a balanced read array voltage to said SRAM array during a read operation of said balanced SRAM bit, and where said balanced read array voltage is equal to said balanced write array voltage.

6. The integrated circuit of claim 5, where said balanced write array voltage and said balanced read array voltage are equal to a logic transistor Vdd.

7. The integrated circuit of claim 5, where a drive current of a pullup transistor in said unbalanced SRAM bit is at least 10% higher than a drive current of a pullup transistor in said balanced SRAM bit.

8. The integrated circuit of claim 5, where a turn on voltage of said pullup transistor in said unbalanced SRAM bit is at least 10% lower than a turn on voltage of a pullup transistor in said balanced SRAM bit.

9. The integrated circuit of claim 5, where a transistor width of a pullup transistor in said unbalanced SRAM bit is at least 10% wider than a transistor width of a pullup transistor in said balanced SRAM bit.

10. The integrated circuit of claim 5, where a gate length of a pullup transistor in said unbalanced SRAM bit is at least 10% shorter than a gate length of a pullup transistor in said balanced SRAM bit.

11. The integrated circuit of claim 5, where a gate length of a pulldown transistor in said unbalanced SRAM bit is at least 10% shorter than a gate length of a pulldown transistor in said balanced SRAM bit.

12. The integrated circuit of claim 5, where a drive current of a passgate transistor in said unbalanced SRAM bit is at least 10% lower than a drive current of a passgate transistor in said balanced SRAM bit.

13. The integrated circuit of claim 5, where a transistor width of a passgate transistor in said unbalanced SRAM bit is at least 10% narrower than a transistor width of a passgate transistor in said balanced SRAM bit.

14. The integrated circuit of claim 5, where a gate length of a passgate transistor in said unbalanced SRAM bit is at least 10% longer than a gate length of a passgate transistor in said balanced SRAM bit.

15. The integrated circuit of claim 5, where a turn on voltage of said passgate transistor in said unbalanced SRAM bit is at least 10% higher than a turn on voltage of a passgate transistor in said balanced SRAM bit.

16. The integrated circuit of claim 5, further comprising:
a balanced SRAM array coupled to said voltage generator, said balanced SRAM array containing balanced SRAM bits; and
an unbalanced SRAM array coupled to said voltage generator, said unbalanced SRAM array containing unbalanced SRAM bits.

17. The integrated circuit of claim 16, where said voltage generator comprises a first voltage generator which supplies a balanced write array voltage and a balanced read array voltage to said balanced SRAM array, and a second voltage generator which supplies said minimum unbalanced write array voltage and said minimum unbalanced read array voltage to said unbalanced SRAM array.

18. The integrated circuit of claim 17, where said first voltage generator is a power supply that also supplies Vdd to logic transistors in said integrated circuit.

19. A process of operating an integrated circuit containing an SRAM array, comprising:
during a read operation applying a minimum unbalanced read array voltage to a pullup transistor of an unbalanced SRAM bit in said SRAM array; and
during a write operation applying a minimum unbalanced write array voltage to said pullup transistor of said unbalanced SRAM bit where said minimum unbalanced read array voltage is at least 50 mV lower than said minimum unbalanced write array voltage and said SRAM array is operating in read/write mode.

20. The process of claim 19, where said minimum unbalanced read array voltage is up to 240 mV lower than said minimum unbalanced write array voltage.

21. The process of claim 19, where said minimum unbalanced write array voltage is above a logic transistor Vdd and said minimum unbalanced read array voltage is below said logic transistor Vdd.

22. The process of claim 19, where said minimum unbalanced write array voltage is equal to a logic transistor Vdd.

23. The process of claim 19, further comprising:
during a read operation applying a balanced read array voltage to a balanced SRAM bit in said SRAM array; and
during a write operation applying a balanced write array voltage to said balanced SRAM bit, where said balanced read array voltage is the same as said balanced write array voltage.

24. The process of claim 23, where said balanced write array voltage and said balanced read array voltage are equal to a logic transistor Vdd.

* * * * *